United States Patent
Rao et al.

(10) Patent No.: US 6,911,838 B2
(45) Date of Patent: Jun. 28, 2005

(54) ONLINE DETECTION OF SHORTED TURNS IN A GENERATOR FIELD WINDING

(75) Inventors: Kotesh Kummamuri Rao, Pearland, TX (US); Gregory John Goodrich, Scotia, NY (US)

(73) Assignee: General Electric Company, Schenectady, NY (US)

( * ) Notice: Subject to any disclaimer, the term of this patent is extended or adjusted under 35 U.S.C. 154(b) by 267 days.

(21) Appl. No.: 10/401,600

(22) Filed: Mar. 31, 2003

(65) Prior Publication Data

US 2004/0189279 A1 Sep. 30, 2004

(51) Int. Cl.[7] .................... G01R 31/34; G08B 21/00
(52) U.S. Cl. ........................... 324/772; 340/648
(58) Field of Search ............................ 324/772, 545, 324/546; 340/648; 702/58, 59

(56) References Cited

U.S. PATENT DOCUMENTS

| | | | |
|---|---|---|---|
| 3,506,914 A | | 4/1970 | Albright et al. |
| 4,136,312 A | * | 1/1979 | Salon et al. ............ 324/545 |
| 4,377,784 A | * | 3/1983 | Saito et al. ............ 324/772 |
| 4,667,148 A | | 5/1987 | Albright et al. |
| 4,851,766 A | * | 7/1989 | Shiobara et al. ............ 324/772 |
| 5,252,915 A | * | 10/1993 | Sedding et al. ............ 324/772 |

OTHER PUBLICATIONS

"Interturn Short–Circuit Detector For Turbine–Generator Rotor Windings", D.R. Albright, pp. 3–11, (Jul., 1970).
"Detection of Shorted Turns in Generator Field Windings", GE Energy Services, pp. 1–2, (Feb., 2002).
"Generator Field Winding Shorted Turn Detector (Flux Probe)", GE Installation and Service Engineering *Steam Turbine*, pp. 1–21, Nov., 1991.

* cited by examiner

*Primary Examiner*—Ernest Karlsen
(74) *Attorney, Agent, or Firm*—Nixon & Vanderhye P.C.

(57) ABSTRACT

A method for detecting a shorted turn in a synchronous machine having a rotor using a magnetic flux probe is disclose having the steps of: monitoring a signal from the flux probe during on-line operation of the machine; integrating the flux probe signal to generate a flux density data trace that repeats during each rotor revolution; upon detecting movement in the flux density zero-crossing, capturing the flux probe signal for a current rotor revolution for a variety of machine load conditions, and performing a shorted turn analysis with the captured flux signal data.

17 Claims, 7 Drawing Sheets

ONLINE DETECTION OF SHORTED TURNS IN A GENERATOR FIELD WINDING

BACKGROUND OF THE INVENTION

The present invention relates to the detection of electrical shorts in synchronous machine field windings and, in particular, to the detection of electrical shorts in the winding turns of a generator.

The field windings in the rotor of a generator are generally an annular array of conductive coil bars arranged in slots around the outer periphery of the rotor. The coil bars extend longitudinally along the length of the rotor and are connected by end turns at each end of the rotor. A connected pair of coil bars and end turns form a coil winding turn.

Several coil winding turns are arranged on a rotor to form a pole. A rotor may have multiple poles, e.g. two or four poles. An exciter circuit applies DC (direct current) to the coils bars of the rotor. The insulation separating the conductor bars or end turns of a rotor of the above type may break down and cause a shorted circuit across one or more coils of the winding. These short circuits in the coil windings are collectively referred to as shorted turns.

A coil winding short can cause a variety of overheating conditions and related vibration problems. Identification of shorted turns in a timely and cost-effective manner is desirable to reduce the off-line downtime period needed to repair shorts in the coil windings of the generator. A flux probe sensor is introduced in the air-gap. The sensor generates a signal proportional to the rate of change of the electromagnetic flux in the air-gap.

In conventional practice, shorted turns are identified and trended by performing periodic (annual or bi-annual) tests on the generator field coil windings. These tests are conducted by trained specialists who connect an analyzer, having a processor and monitor, to the flux probe and to a once per revolution output of the generator. The flux probe data may be collected at different generator load points, typically at the load points of: open circuit, 10%, 20%, 30%, 40%, 50%, 60%, 70%, 80%, 90%, 100% and full-speed no load all with zero Mega-Volt-Amperes-Reactive (MVARS), e.g., no reactive power. The load changes are necessary because different coils are "sensitized" at different load points. Analysis of the coils when they are each "sensitized" provides a more accurate shorted turn analysis of the coils, than is generally achieved by analysis of the coils when they are not "sensitized".

In the past, obtaining a comprehensive shorted turn analysis has often required that generator load changes be made and such load changes require extensive coordination between the test specialist and the load dispatcher. In some cases, it may be necessary to take the generator unit off-line to obtain data corresponding to the higher numbered coils in the rotor.

A disadvantage of a conventional shorted turn analysis is that a specialized testing sequence is followed when the generator is being operated suboptimally. This sequence requires extensive coordination between the test specialist and the load dispatcher including taking the generator off-line. The shorted turn detection process may involve inefficient use of the generator while the generator is tested at the various load conditions needed to collect flux data while each of the coils are sensitized. Accordingly, there is a long-standing but previously unmet need for a testing technique to locate turn shorts in a generator field winding, which does not require lengthy testing of a generator outside its normal operating envelope.

SUMMARY OF INVENTION

In a first embodiment, the invention is a method for detecting a shorted turn in a synchronous machine having a rotor using a magnetic flux probe, wherein the steps of the method are: monitoring a signal from the flux probe during on-line operation of the machine; integrating the flux probe signal to generate a flux density data trace that repeats during each rotor revolution; segmenting one cycle of the flux density signal and upon detecting a variation in the repeating flux density trace, capturing the flux probe signal data during a rotor revolution period; repeating the steps of monitoring, integrating and capturing flux data as the on-line operation progresses through various machine load conditions and different coils being "sensitized"; and performing a shorted turn analysis with the captured flux signal data until a complete assessment of coil health is obtained.

DETAILED DESCRIPTION OF THE DRAWINGS

Figure 1:
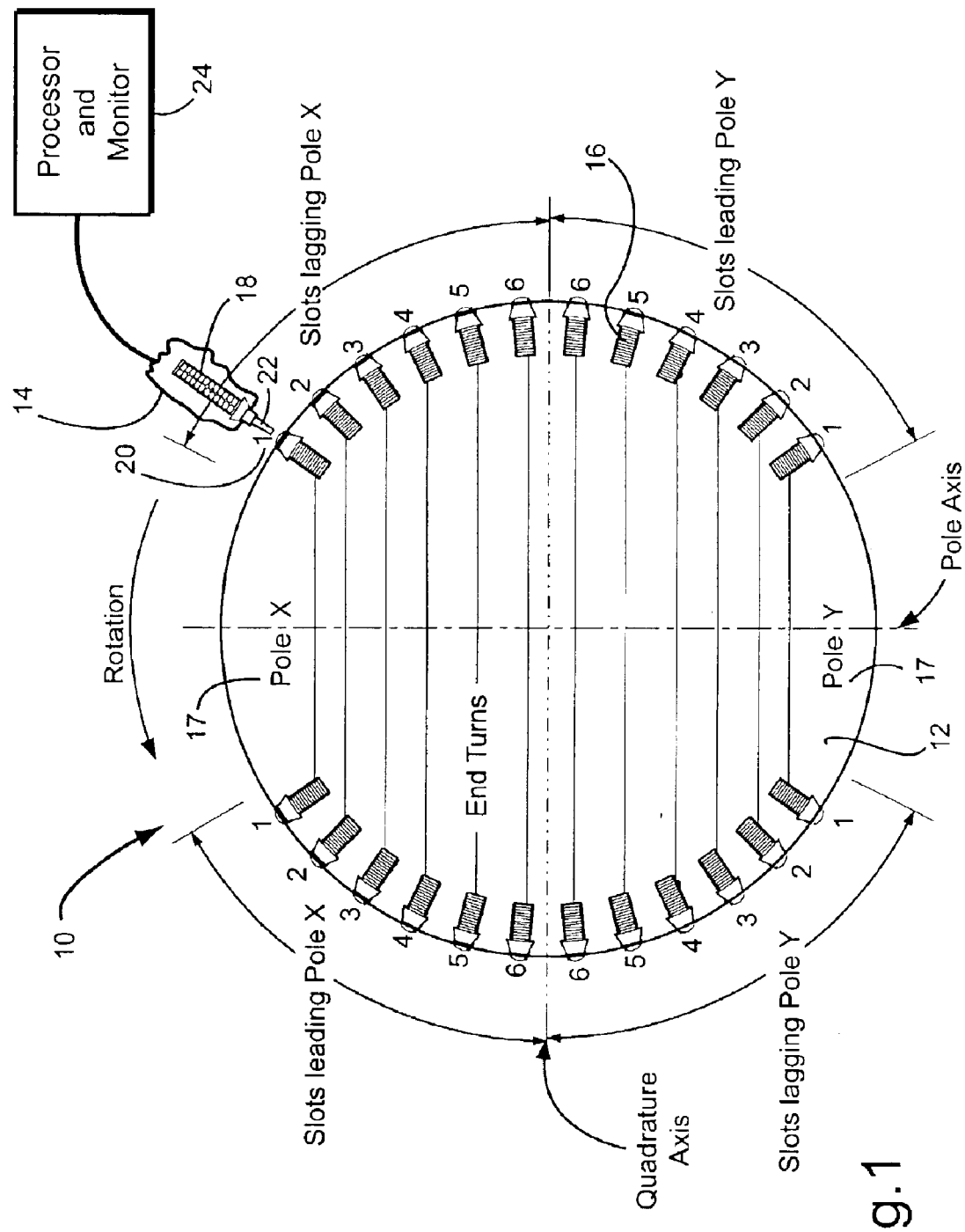
FIG. 1 is a cross-sectional diagram of a conventional 2-pole generator having a stator winding, a rotor winding and a flux probe in-place.

A new testing procedure has been developed to locate a short in a generator field winding, such as the winding shown in FIG. 1. The testing procedure employs a standard magnetic flux probe 22, which may be a conventional temporary or permanently fixed probe that is already installed or is installable in a generator stator 14. Data from the flux probe 22 is automatically collected while the generator is on-line and producing electrical power for a public utility, for example. The collected data is stored for later use in identifying shorts in the coils of the generator field winding.

The continuous and automatic data acquisition system described herein, performs data acquisition regarding shorted turns. Reduction and analysis of the data is triggered based on the locations of the flux density zero-crossings. Automating the collection of magnetic flux data from an operating, on-line generator should reduce generator off-line periods and provide a convenient and cost efficient process to detect shorts in the end turns of generator field windings. An on-line monitor 24 of captured flux data can be reviewed remotely by a specialist to detect shorted turns, or the monitor can operate autonomously and may be periodically reviewed to evaluate the health of the generator.

FIG. 1 is a cross-sectional view of a synchronous dynamo-electric machine 10 such as, for example, a large turbine-generator, that employs the interaction of magnetic fields in its rotor 12 and stator 14 to produce electric power. High alternating current (AC) output power is conventionally generated in the stator armature winding 18 which operates as an armature. Field windings 16 of coils on the rotor 12 are conventionally excited by a direct current (DC) field supply. The DC field supply is generated either by an external DC exciter generator and fed through slip rings to the rotor field windings, or in a brushless generator-rectifier assembly rotating with the rotor.

Rotors 12 of large turbine-generators conventionally have two, four or more poles 17 formed by the arrangement of the lateral slots in the rotor that contain the field windings 16 and by interconnecting the windings with end turns. For purposes of illustration, a two-pole generator is described herein, although the invention is not limited to two-pole generators. The rotor coil windings 16 are symmetrically arranged in the slots with respect to a pole axis 17 and form an annular array around the rotor.

An annular gap 20, conventionally referred to as an air-gap, separates the rotor windings 16 from the armature windings 18 of the stator. The flux probe 22 may extend radially through the stator 14 and into the air gap 20. The flux probe may be permanently mounted in the stator or may be temporarily inserted into the air gap between the stator and rotor. The flux probe senses the rotor field winding slot leakage flux. The leakage flux is indicative of the rotor movement and, in particular, the alternating passage of rotor windings and slots across the sensing field of the probe. The flux probe produces a voltage that is proportional to the rate of flux change as the rotor turns.

The flux probe signal is collected by a processor and monitor 24 that may be associated with an instrument monitoring the generator. The processor may be on site with the generator or located at a remote location. The processor 24 may monitor in real time the voltage level from the flux probe signal record.

Figure 2:
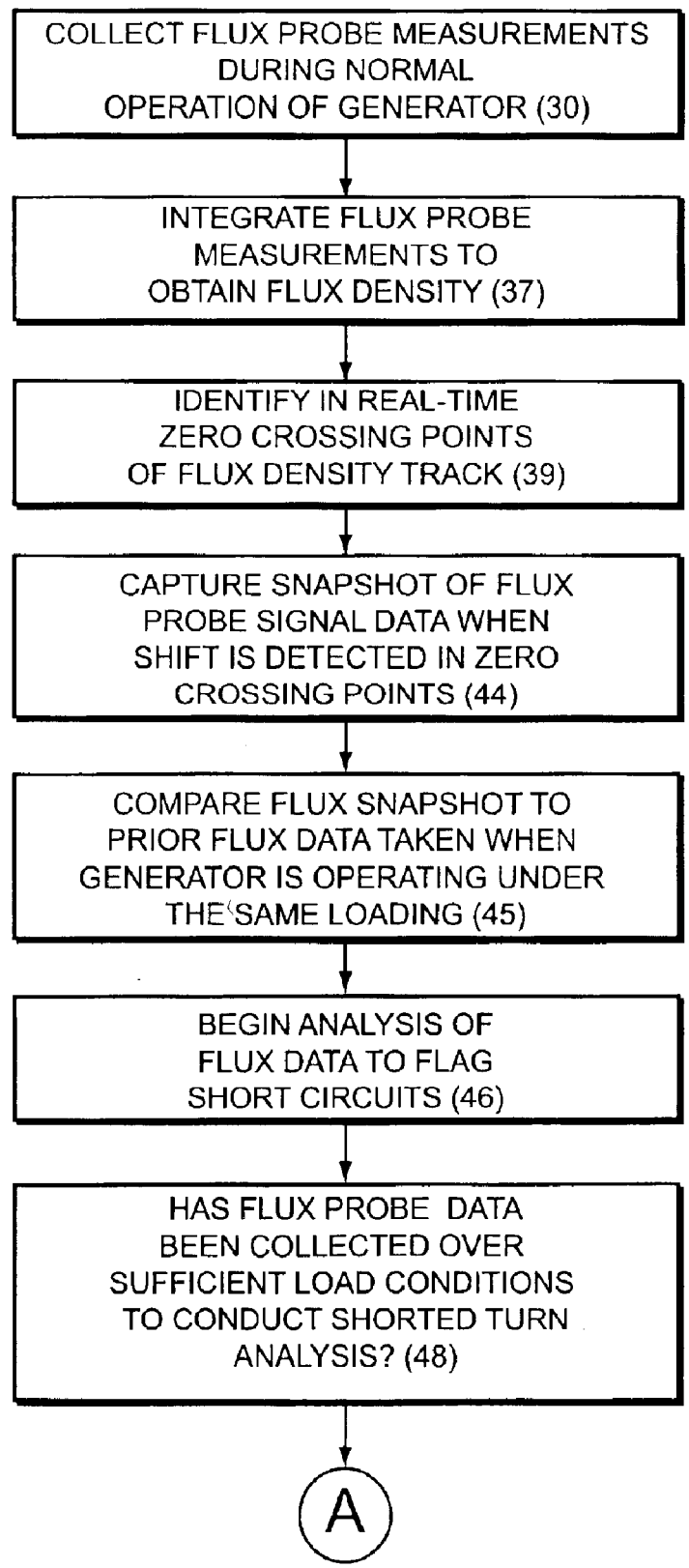
FIGS. 2 and 3 are flow charts showing exemplary steps for detecting a shorted turn in a field winding.
Figure 3:
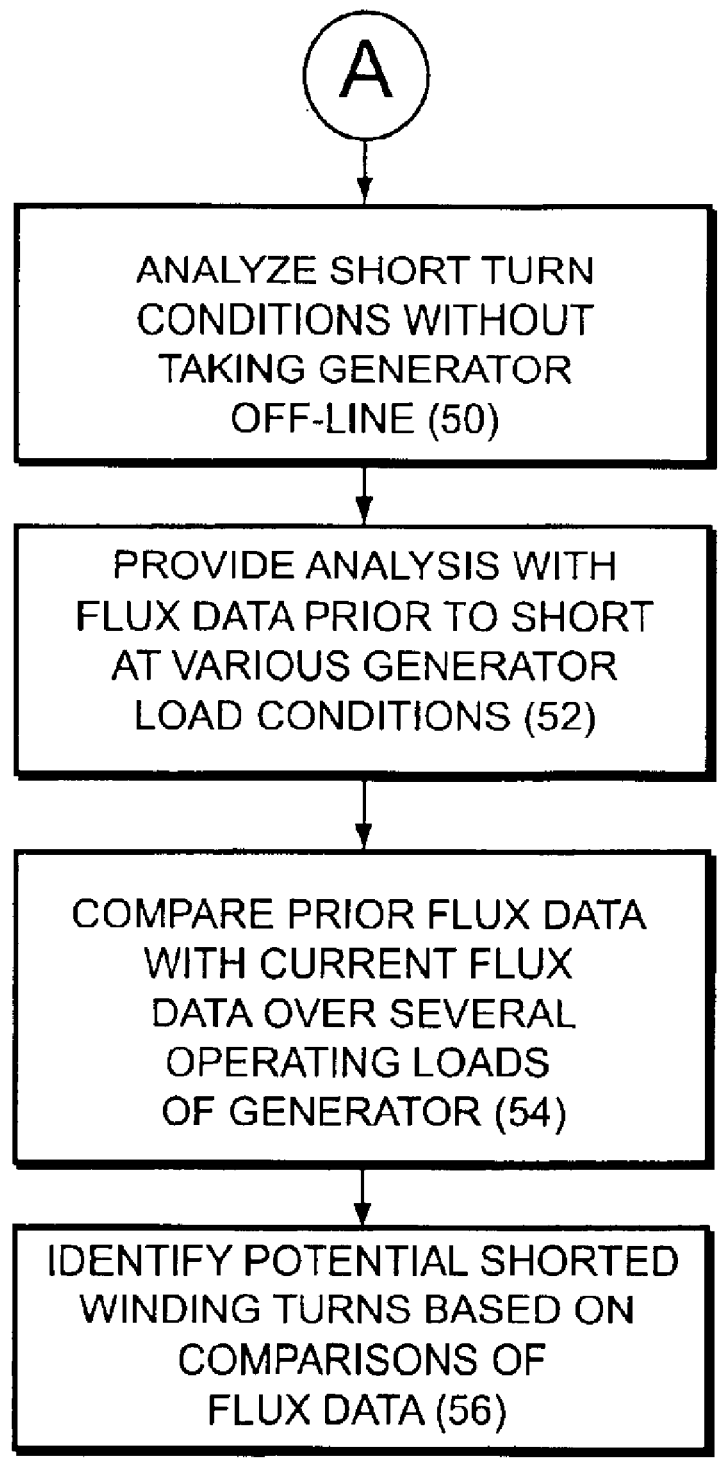

FIGS. 2 and 3 are charts of process steps for identifying a shorted turn in a field winding of a generator or other synchronous machine. In step 30, flux probe measurements are taken during normal operation of the generator. The flux probe signal provides an indication of the magnetic flux around the stator and, particularly, in the annular air gap between the rotor and stator.

Figure 4:
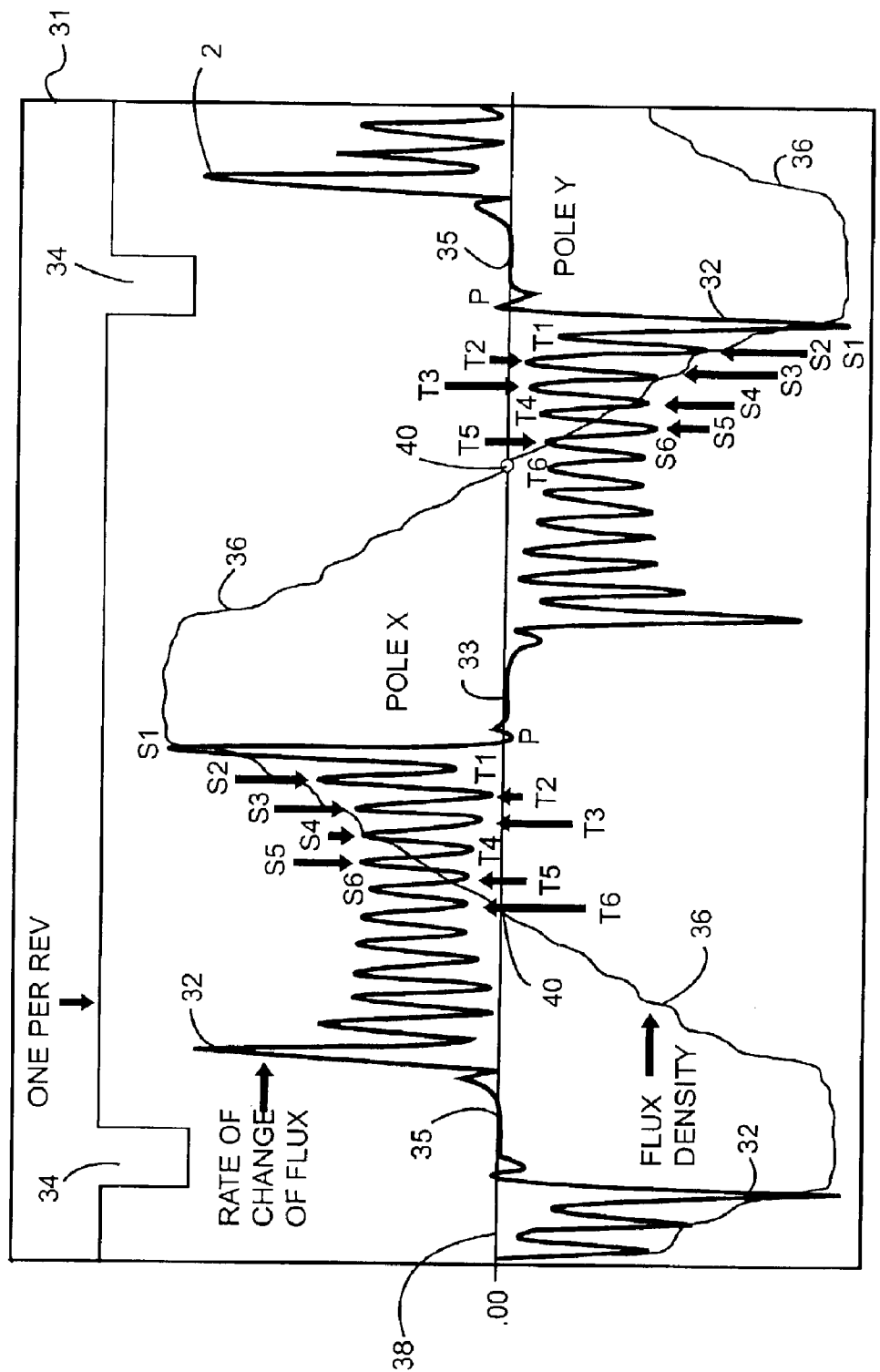
FIGS. 4, 5 and 6 are exemplary charts of a flux probe signal and flux density traces.

FIG. 4 is an exemplary chart 31 of flux probe voltage signal 32 verses time, represented by horizontal axis 38. The flux probe signal data 32 shows the normal slot leakage voltage reversals of the rotor for one revolution of the rotor. The flux probe signal 32 oscillates as the stationary flux probe senses the passage of coil bars in slots (S) and teeth (T) on the rotor. During one revolution 34 of the rotor, the flux probe senses the flux in the air gap 20 due to the coils in each of the poles (P) of the rotor.

The amplitude of the flux signal 32 during one revolution of the rotor is proportional to the number of active turns in a slot being sensed and the magnitude of the air-gap flux density. Maximum flux density occurs at the leading edge of each pole and progressively decreases toward the quadrature axis of the pole. The pattern of flux variation near the field winding is a signature characteristic of each field of a particular rotor and its generator. As the rotor turns, the flux probe senses changes in the magnetic flux field in the air gap around the entire circumference of the rotor.

The flux probe signal 32 is integrated in real time to yield the flux density data trace 36, in step 37. The processor 24 identifies the zero-crossing location in real-time. Further, the processor 24 may record and store the flux probe voltage signal 32 and flux density data 36 collected during certain periods, such as one rotor revolution. The processor may store data on flux and flux density for several one revolution periods corresponding to various changes in the flux density. The processor may also record other related electrical and load information, e.g., generator load, field voltage and field current corresponding to the recorded flux probe voltage levels and flux density data.

The flux probe and flux density data may be captured when certain events occur (step 44), such as a change in the zero crossing point 40 of the flux density trace. The flux density trace crosses the time axis 38 at a zero-crossing point(s) 40. A zero crossing point 40 will generally occur during one revolution of the rotor and for each rotor pole 17. The zero-crossing points should occur at the same time displacement in each rotor revolution cycle, provided that the load on the generator and coil conditions do not change.

During normal generator operation the cyclical flux probe signal, e.g., the flux signal during one rotor revolution, should be largely unchanged, assuming that no shorts develop in the winding turns and the operating load of the generator remains constant. Similarly, the flux density trace 36 (which is a function of the integration of the flux probe signal) and the zero-crossing points 40 of density trace should remain unchanged if no shorts develop in the winding turns and the load on the generator remains relatively constant. The flux probe signal, and hence the flux density trace and its zero-crossing points, will vary if a short occurs in one of the winding turns or if the load on the generator changes.

The processor 24 detects changes in the coil condition, e.g., shorts, or changes in the generator load by monitoring the zero-crossing point 40 for changes in the flux density from one rotor revolution to the next. The processor 24 monitors the zero-crossing points to detect changes in the timing of the zero-crossing points, in step 44. The processor executes an algorithm to detect changes in zero-crossing points 40. The algorithm segments the area between the quadrature axis to the pole face into a series of regions that are in number at least twice the number of coils per pole. The processor then determines in which region the zero crossing 40 occurs, and if the region in which the zero cross has occurred is different than in a preceding revolution. Changes in the region of the zero crossing indicates that the windings have experienced a load change or a possible short. Detecting when the flux density zero crossing shifts from one region to another provides sufficient resolution of zero crossing shifts to identify shorted turns and load changes.

Figure 5:
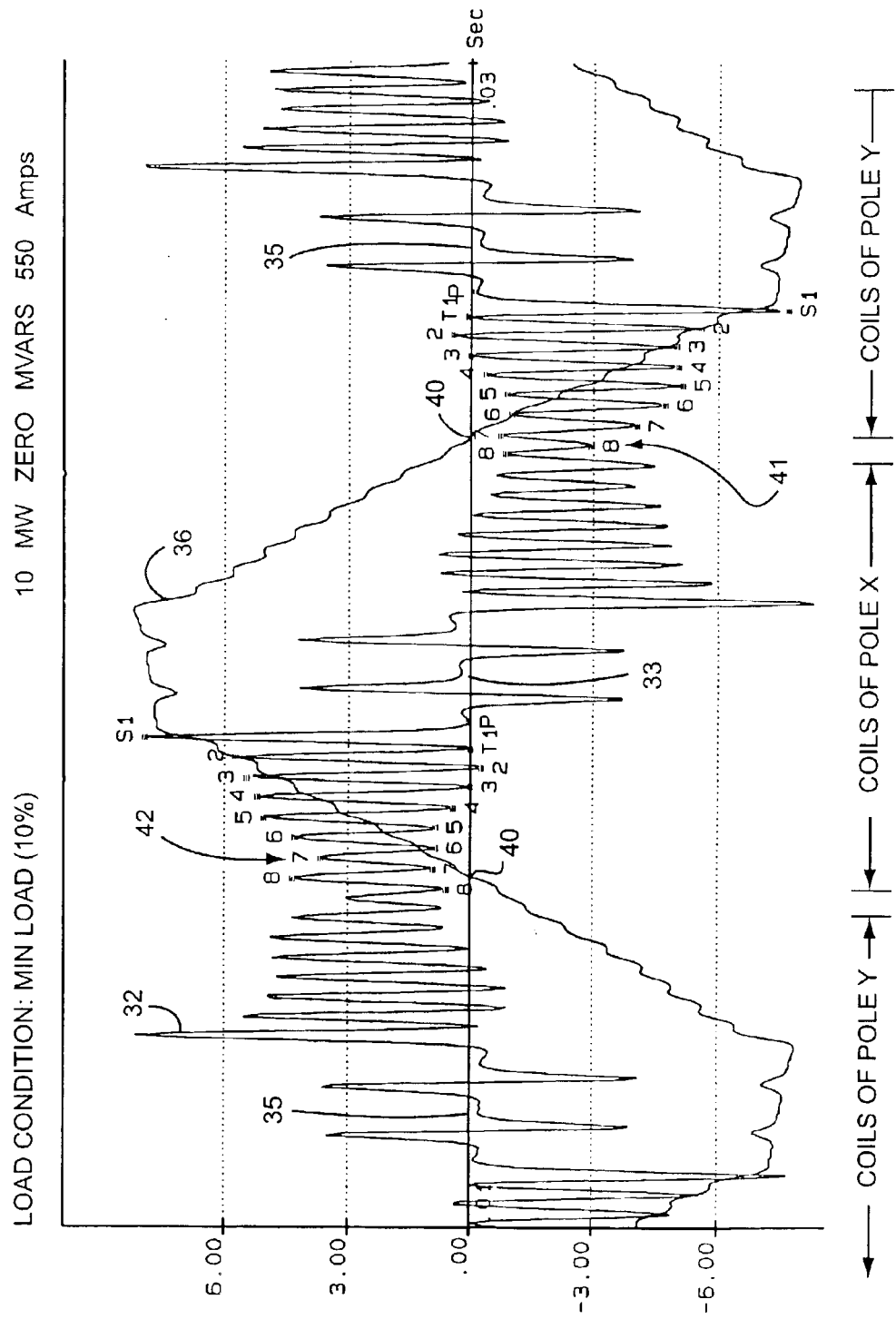
Figure 6:
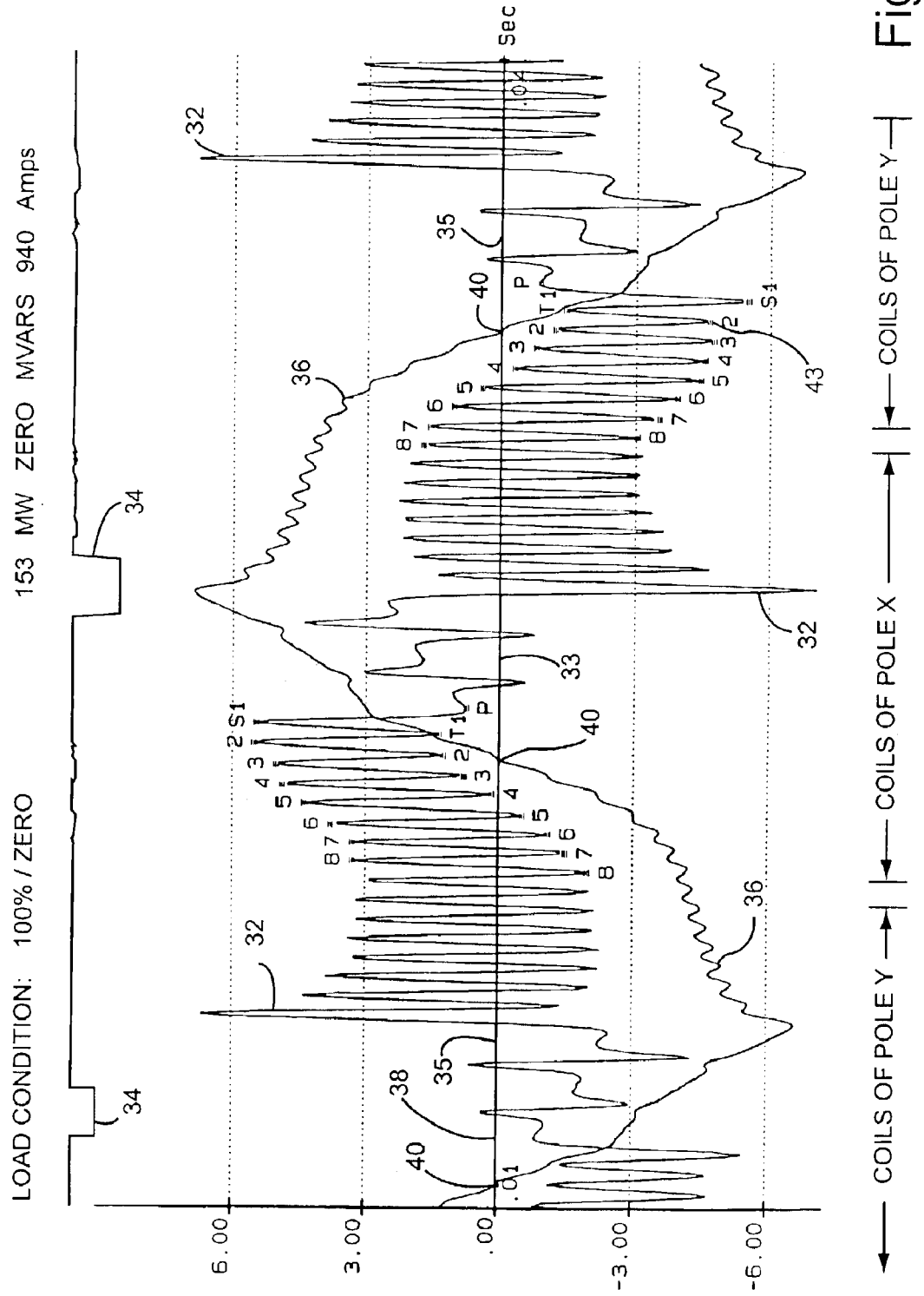

FIGS. 5 and 6 are charts that show flux probe voltage signal traces 32 and flux density traces 36 for a generator operating at ten percent (10%) load (FIG. 5) and at full (100%) load (FIG. 6). A comparison of FIGS. 5 (10% load) and 6 (100% load) shows that a change in the load on the generator alters the flux probe signal 32, the flux density trace 36, and the zero-crossing points 40 of the flux density. The coils associated with pole X 33 and pole Y 35 are indicated on the charts. A shorted turn in a winding is indicated by flux signal amplitudes 41, 42, 43 for a coil in a slot that is uncharacteristically small in comparison with the signal amplitudes for adjacent slots and the same slot of the opposite pole. The aberrations 41, 42, 43 in the flux signal for the shorted turn should appear once during each revolution of the rotor. As can be seen in FIGS. 5 and 6, the change in the flux signal amplitude due to a shorted coil is obscure and is not readily apparent, except to a trained technician.

An aberration in the flux field due to a shorted turn does not appear during all operating conditions of the generator. The shorted turns of FIG. 5 (see flux signals at 41, 42) correspond to shorts in a particular coil, e.g. (41) coil #8 of pole Y and (42) coil #7 of pole X. The shorted turns 43 that appear in FIG. 6 correspond to a short in coil #2 of pole Y. The flux probe signals shown in FIGS. 5 and 6 are of the same generator which has shorted turns in six of the eight coils including a three turn short in coil #2 of pole Y (43), a two turn shorts in coil #7 of pole X (42), and a five turn shorts in coil #8 of pole Y (41). The number of shorts in a coil is proportional to the reduction in the "sensitized" flux amplitude due to the shorts. The shorts in coil #7 (42) and #8 (41) appear in the flux signal when the generator is under low loads as seen in FIG. 5 and these shorts do not appear when the generator is operating near full load (FIG. 6). The short in coil #2 (43) appears in the flux signal when the generator is operating near full load (FIG. 6) and not when the generator is near low loads (FIG. 5). It is because of this phenomena that data must be collected over a large load swing.

Collecting all of the flux probe data during the entire time of generator operation may result in the storage of excessive amounts of data and excessive data for a specialist to readily review. To reduce the amount of data stored and to cull the amount of redundant flux data to be reviewed by a technician, the processor may be programmed to capture, in step 44, the flux probe data when the zero-crossing point 40 of the flux density trace 36 shifts from one region to another.

The zero-crossing point 40 of the flux density trace is detected by the processor 24 after it integrates the flux probe signal in real time, during step 39. To detect a shift in the zero-crossing point, the processor may monitor the timing of the zero-crossing points during each rotor revolution. The crossing points 40 should occur at the same time during each revolution, unless the load on the generator changes or a short occurs in a winding. The processor may temporarily store data regarding the timing of flux density zero-crossing points for one or more prior rotor revolution(s).

As the flux density zero-crossing point is determined for each successive rotor revolution period, the processor compares the timing of the zero-crossings for the most current revolution to the zero-crossing timing of one or more revolution periods. The processor determines whether the current zero-crossing timing has changed substantially, such as by detecting that the crossing has moved into a different time region. If the zero-crossing has substantially shifted, the processor captures data regarding the flux probe signal data, flux density trace and coil load conditions for the current revolution period, in step 44. This collected data is electronically stored for later analysis by a specialist or for further processing by the processor 24.

The monitoring of flux data, detecting changes in the flux density zero-crossing point and capturing data when the zero-crossing point changes, continues during the on-line operation of the generator. The processor may detect many changes in the zero-crossing point and capture the flux data each time such a change is detected. The detection of a zero-crossing change (and the capturing of flux data) will mostly occur for reasons other than a shorted turn in a coil. The zero-crossing point often changes when the coil conditions change, such as when the loading of the generator is varied (both Megawatts and Megavars). Accordingly, much of the flux data captured and stored will not indicate a change in shorted turns.

Data sufficient to identify a shorted turn is collected by capturing flux data each time the zero-crossing 40 timing changes. The flux data is captured regardless of whether the zero-crossing timing change is due to a load change or a shorted coil. Collecting flux data over a wide range of operating loads and over an extended period of on-line operation, should capture flux data sufficient to detect a shorted turn in any coil.

Much of the captured flux data will represent data captured solely because the load on the generator changed and will not indicate a shorted turn. The amount of collected data should not be excessive and can be readily reviewed by a specialist searching for shorted turns. In step 45, the processor 24 may be programmed to compare the amplitudes of the coils of the different poles of the flux probe signal in the time regions aligned with the flux density zero crossing. The current captured flux data may be flagged by the processor as indicating a possible shorted coil turn in a given pole, if the amplitude of that "sensitized" coil for the captured flux data is substantially lower than the corresponding amplitudes of the other "sensitized" coil for the other pole or poles. This flagging of captured flux data may assist a specialist to quickly identify a shorted turn. Flagged flux data may thus be evaluated soon after it occurs and while the generator continues to operate on-line without any special intervention.

A specialist may periodically review the collected data taken upon changes in the zero-crossings 40 to determine whether a short has occurred in the windings, in step 45. The processor may generate a report of flagged flux data (see step 46) that may indicate a short or may generate a report when the flux data has been collected at all of the load conditions needed for a shorted turn analysis. The specialist may review the collected flux probe data to determine, in step 48, whether data has been recently collected for sufficient generator operating conditions to evaluate the flux data for shorted turns. The flux data should be collect for every time-region that the flux density moves into. In addition, the processor may report, in step 50, to the specialist the times and dates at which the flux load data has been collected for each of zero-crossing excursions.

When the operator has current data from the flux probe signals for all generator load conditions or flux data from load conditions sufficient to conduct a shorted turn analysis, the specialist reviews the collected flux probe data and flux density traces to determine whether a short circuit exists in any of the coils, in step 50. The analysis may require the specialist to compare the current data of flux and flux density with historic flux and flux density data taken on the same generator at similar operating loads. The historic data may be taken at a time when it is known that there are no shorted winding turns. This historic data may be electronically saved as flux signature plots for each of several generator operating loads. The flux signature plots are obtained by a specialist for selected generator load conditions, in step 52. Alternatively, the specialist may compare the amplitude of the flux signal for a coil suspected of having a short with the flux amplitude of a similar coil in another pole. The flux amplitudes of the coils being compared are amplitudes taken from the same rotor revolution.

Figure 8:
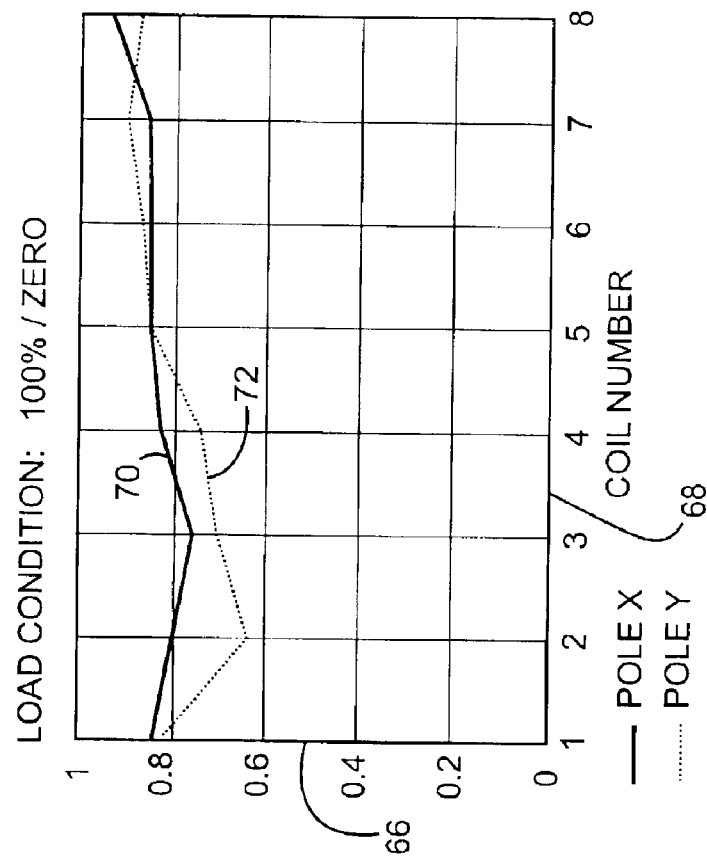
FIGS. 7 and 8 are exemplary flux data signature plots.
Figure 7:
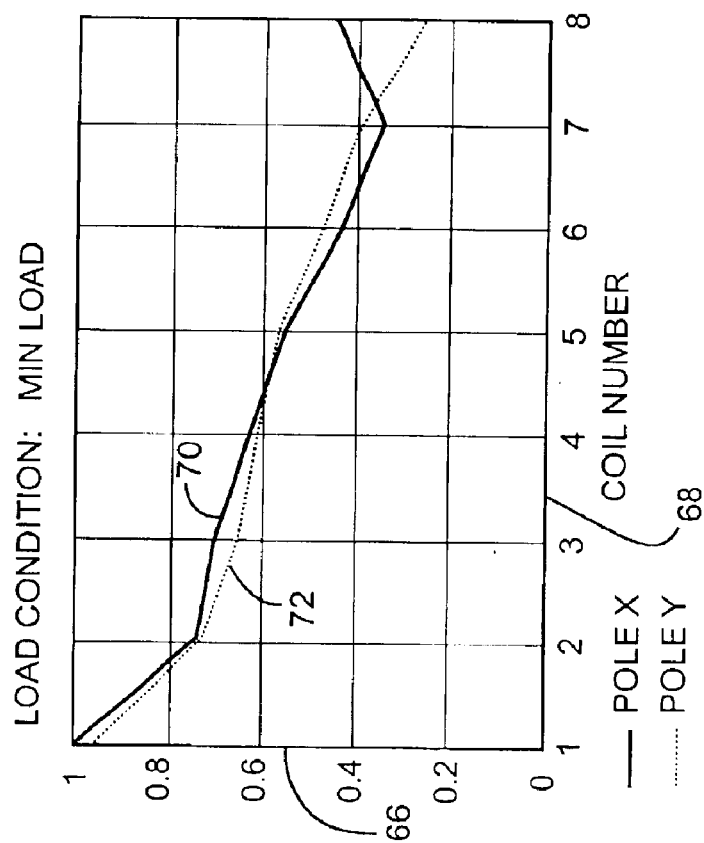

The flux data shown in FIGS. 7 and 8 are examples of signature plots of flux probe data. The signature plots each correspond to a different generator operating load. FIG. 7 presents flux data at a minimum (10%) generator operating load and FIG. 8 presents flux data at a 100% generator speed with no load. Each signature plot shows the normalized flux magnitude 70, 72 of all coils corresponding to each rotor pole. For example, the flux magnitude 70 at pole X is superimposed on the flux magnitude 72 for pole Y. The signature plots are generated using the flux data from a revolution of the rotor, such as shown in FIGS. 5 and 6. Similar flux magnitude versus coil number plots for each pole (as are shown in FIGS. 7 and 8) may be prepared from current flux data such as shown in FIGS. 5 and 6.

By comparing the current signature plot to a previous signature plot, shorted turns in the coils of a pole may be readily identified, in step 56. A specialist can detect a short in a winding turn by comparing current flux and flux density data to a signature plot or other historical flux and flux density data for several generator load conditions, in step 58.

The specialist compares the flux and flux density data from a reduced set of zero-crossing locations corresponding to twice the number coils for any given pole. Moreover, this comparison of data may be performed while the generator is on-line, as it can be accomplished using data captured by the processor and stored electronically.

The comparison of flux data and the analysis to detect shorted turns may be conducted without taking the generator off-line, if sufficient flux data has been collected to perform the analysis during the on-line collection of flux data when a shift in the zero-crossing point is detected. Generators often go through unplanned load reductions and even trip events, and the additional data corresponding to the off-line conditions can be automatically collected during that process. A predetermined period, e.g., one month, of generator operation may be sufficient to collect enough flux data to properly detect shorts in coil turns. Because all or most of the data needed to detect shorts may be collected during normal operation, the need for scheduled outages or disruption of routine operation of the machine is minimized.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for detecting a shorted turn in a synchronous machine having a rotor using a magnetic flux probe, said method comprising:
   a. monitoring a signal from the flux probe during on-line operation of the machine;
   b. integrating the flux probe signal to generate a flux density data trace for a rotor revolution;
   c. upon detecting a variation between a current flux density trace and a prior flux density trace, capturing the flux probe signal for a current rotor revolution;
   d. repeating steps (a) through (c) as the on-line operation progresses through various machine load conditions; and
   e. performing a shorted turn analysis with the captured flux signal data.

2. A method as in claim 1 wherein the flux probe data is integrated in real time.

3. A method as in claim 1 wherein steps (c) and (d) are performed to capture the flux probe data while each of the individual coils in the rotor are sensitized.

4. A method for detecting a shorted turn in a synchronous machine as in claim 3 wherein an amplitude reduction for a sensitized coil in the flux probe is detected based on a variation in a timing of when the flux density trace has a predetermined value during each rotor revolution.

5. A method for detecting a shorted turn in a synchronous machine as in claim 1 wherein the variation in the flux density trace is a variation in a timing of when the flux density trace has a zero value during each rotor revolution.

6. A method for detecting a shorted turn in a synchronous machine as in claim 1 wherein the variation in flux density trace is a variation in a timing of when the flux density trace has a zero value and the variation occurs between successive rotor revolutions.

7. A method for detecting a shorted turn in a synchronous machine as in claim 1 wherein the variation in the flux density trace occurs between the flux density trace for a current rotor revolution and the flux density trace for a preceding rotor revolution.

8. A method for detecting a shorted turn as in claim 1 wherein the synchronous machine is a generator.

9. A method for detecting a shorted turn as in claim 1 wherein the rotor has a plurality of magnetic coil poles.

10. A method for detecting a shorted turn in field coils of a rotor of a generator using a magnetic flux probe, said method comprising:
    a. collecting data generated by the flux probe during on-line operation of the generator;
    b. integrating in real-time the flux probe signal to generate a flux density trace for successive rotor revolutions;
    c. upon detecting a variation in the flux density trace for a plurality of rotor revolutions, capturing the flux probe signal of a recent rotor revolution;
    d. repeating steps (a) through (c) as the generator operates at various load conditions; and
    e. performing a shorted turn analysis with the flux probe signal captured in step (c).

11. A method for detecting a shorted turn in a generator as in claim 10 wherein the variation in the flux density trace is a variation in a timing of when the flux density trace has a zero value during each rotor revolution.

12. A method for detecting a shorted turn in a generator as in claim 10 wherein the variation in flux density trace is a variation in a timing of when the flux density trace has a predetermined value during each rotor revolution.

13. A method for detecting a shorted turn in a generator as in claim 10 wherein the variation in flux density trace is a variation in a timing of when the flux density trace has a zero value and the variation occurs between successive rotor revolutions.

14. A method for detecting a shorted turn in a generator as in claim 10 wherein the variation in the flux density trace occurs between the flux density trace for a current rotor revolution and the flux density trace for a preceding rotor revolution.

15. A method for detecting a shorted turn in a generator as in claim 10 wherein step (d) is performed when the machine is at various load conditions.

16. A method for detecting a shorted turn as in claim 10 wherein the rotor has a plurality of magnetic coil poles.

17. A method for detecting a shorted turn as in claim 10 wherein step (d) is performed during a period of no greater than one month.

* * * * *